United States Patent
Yoshikawa et al.

(10) Patent No.: US 11,796,408 B2
(45) Date of Patent: Oct. 24, 2023

(54) METHOD FOR CLEANING RECEPTOR LAYER OF SURFACE STRESS SENSOR

(71) Applicant: NATIONAL INSTITUTE FOR MATERIALS SCIENCE, Ibaraki (JP)

(72) Inventors: Genki Yoshikawa, Ibaraki (JP); Takahiro Nemoto, Ibaraki (JP); Makito Nakatsu, Ibaraki (JP); Naoto Takeda, Ibaraki (JP); Kota Shiba, Ibaraki (JP); Kosuke Minami, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 394 days.

(21) Appl. No.: 17/267,094

(22) PCT Filed: Aug. 28, 2019

(86) PCT No.: PCT/JP2019/033612
§ 371 (c)(1),
(2) Date: Feb. 9, 2021

(87) PCT Pub. No.: WO2020/050110
PCT Pub. Date: Mar. 12, 2020

(65) Prior Publication Data
US 2021/0215556 A1    Jul. 15, 2021

(30) Foreign Application Priority Data

Sep. 3, 2018  (JP) ................. 2018-164127

(51) Int. Cl.
*G01L 1/00* (2006.01)
*G01L 1/26* (2006.01)
(Continued)

(52) U.S. Cl.
CPC ............... *G01L 1/26* (2013.01); *B08B 7/005* (2013.01); *B08B 7/0071* (2013.01); *G01L 1/2268* (2013.01); *H01L 29/84* (2013.01)

(58) Field of Classification Search
CPC ......... G01L 1/26; G01L 1/2268; B08B 7/005; B08B 7/0071; H01L 29/84
See application file for complete search history.

(56) References Cited

U.S. PATENT DOCUMENTS 4,125,820 A * 11/1978 Marshall ............... G01L 9/0054
73/777
5,985,673 A    11/1999 Bao et al.
(Continued)

FOREIGN PATENT DOCUMENTS

| JP | 3-272444 | 12/1991 |
| JP | 2011-169634 | 9/2011 |

(Continued)

OTHER PUBLICATIONS

Office Action dated Jan. 5, 2023 in corresponding Chinese Patent Application No. 201980047543.X, with English translation.
(Continued)

*Primary Examiner* — Max H Noori
(74) *Attorney, Agent, or Firm* — Wenderoth, Lind & Ponack, L.L.P.

(57) ABSTRACT

A method for cleaning a receptor layer of a surface stress sensor according to an embodiment of the present invention includes, in a surface stress sensor that detects a change in surface stress of a thin film, the change being caused by a receptor layer disposed on a surface of the thin film, causing at least a part of a surface region of the thin film to generate heat or supplying heat to the receptor layer from the outside of the surface stress sensor. This makes it possible to easily perform efficient cleaning of a surface stress sensor such as
(Continued)

a sensor that performs detection using a piezoresistor while avoiding structural complications as much as possible.

6 Claims, 10 Drawing Sheets

(51) Int. Cl.
    *B08B 7/00*     (2006.01)
    *G01L 1/22*     (2006.01)
    *H01L 29/84*     (2006.01)

(56) References Cited

U.S. PATENT DOCUMENTS

| | | | | |
|---|---|---|---|---|
| 2008/0108164 | A1* | 5/2008 | Oleynik | G01N 27/4145 438/49 |
| 2013/0014779 | A1* | 1/2013 | Chen | H01L 21/02063 134/2 |
| 2013/0133433 | A1* | 5/2013 | Yoshikawa | G01N 29/022 73/774 |
| 2014/0352447 | A1* | 12/2014 | Yoshikawa | G01L 1/18 73/774 |
| 2018/0003604 | A1* | 1/2018 | Shiba | G01G 3/13 |

FOREIGN PATENT DOCUMENTS

WO     2011/148774     12/2011
WO     2014/196606     12/2014

OTHER PUBLICATIONS

Office Action dated Dec. 17, 2021 in corresponding Chinese Patent Application No. 201980047543.X, with English translation.
Office Action dated Jun. 29, 2022 in corresponding Chinese Patent Application No. 201980047543.X, with English-language translation.
Office Action dated Nov. 30, 2021 in corresponding Japanese Patent Application No. 2020-541153, together with English translation thereof.
International Search Report (ISR) dated Nov. 26, 2019 in International (PCT) Application No. PCT/JP2019/033612.
Genki Yoshikawa et al., "Two Dimensional Array of Piezoresistive Nanomechanical Membrane-Type Surface Stress Sensor (MSS) With Improved Sensitivity", Sensors, 12, 2012, pp. 15873-15887, cited in the specification.

* cited by examiner

☐ Piezoresistive portion
■ Heavily doped portion
▨ Silicon thin membrane
▨ Support member

METHOD FOR CLEANING RECEPTOR LAYER OF SURFACE STRESS SENSOR

TECHNICAL FIELD

The present invention relates to a method for cleaning a receptor layer of a surface stress sensor represented by a membrane-type surface stress sensor (MSS), and particularly relates to a method for cleaning a receptor layer of a surface stress sensor by using an electric resistor formed in a silicon thin membrane constituting a surface stress sensor body such as a piezoresistor which is an element that detects deformation due to a surface stress or by supplying heat from a heat source disposed outside the surface stress sensor.

BACKGROUND ART

A surface stress sensor detects a change in stress generated in a receptor layer as a change in surface stress on a surface of a sensor body by adsorbing a component in a fluid on the receptor layer on the surface of the sensor body, and can detect various trace components present in a liquid or gas sample by selecting an appropriate receptor layer. The structure and operation of the surface stress sensor, a variety of applications thereof, and the like are already well known to those skilled in the art, but refer to Patent Literature 1, Non Patent Literature 1, and the like as necessary.

One of problems that occur during a measurement using a surface stress sensor is that history of measurements performed so far may affect results of subsequent measurements. One of reasons for this is that various components in a fluid as a target to be measured may be adsorbed on a receptor layer and remain in the receptor layer at a subsequent measurement. Such an influence of the previous measurement often appears in a subsequent measurement performed by changing the target to be measured. As a matter of course, such an influence of history of past measurements on a newly performed measurement may seriously affect measurement accuracy, stability of a measurement, and the like, and therefore should be avoided as much as possible.

In addition to this, the above-mentioned influence may also appear similarly in a series of measurements on the same target to be measured. As is well known, in a measurement using a surface stress sensor, in many cases, a response of the surface stress sensor is not observed by simply supplying a target fluid to be measured (also referred to as a sample gas here when the fluid is a gas) to the surface stress sensor, but the target fluid to be measured and a reference fluid (usually called a carrier gas, a purge gas, or the like when the fluid is a gas) are alternately supplied to the surface stress sensor and a response signal of the surface stress sensor thereto is taken as a response of the surface stress sensor based on the target fluid to be measured. In this case, in a one-cycle measurement in which the target fluid to be measured is supplied to the surface stress sensor and then switched to the reference fluid, a component in the target fluid to be measured adsorbed on the receptor layer in the first half of the cycle is not completely desorbed from the receptor layer by the reference fluid in the second half of the cycle, and therefore often affects a pattern of an output signal from the surface stress sensor in a subsequent cycle. Even if there is such an influence between cycles, various analyzes can be performed as a result of a series of measurement cycles that include the influence. However, it may be convenient if the states of the receptor layer at the times of start of the cycles can be as close to each other as possible. In addition, there may be a case in which, since a component adsorbed on the receptor layer in a previous cycle remains, an output corresponding to a trace component or the like in the target to be measured may be masked from the beginning of supply of the target fluid to be measured in subsequent cycles, and may be hardly detected.

In order to avoid or reduce such an influence of the measurement history, a cleaning process is performed between measurements so as to return the state of the surface stress sensor to the initial state. Such cleaning can be implemented, for example, by supplying the above-described reference fluid or another fluid for cleaning to the surface stress sensor to desorb various substances that may be adsorbed on the receptor layer. As such a fluid for cleaning, an inert gas such as nitrogen or argon is usually used in a case of a gas, and water or the like is used in a case of a liquid. When a substance adsorbed is known, a solvent that sufficiently dissolves the substance may be used. Alternatively, a method is also used in which so-called "co-washing" by supplying a target fluid to be measured to a surface stress sensor is performed a plurality of times prior to an actual measurement to obtain a stable signal by the target fluid to be measured.

However, such a cleaning process is complicated, and it is often difficult to properly perform such a process particularly with an apparatus that may be used by a non-specialist. In a case where a substance strongly adsorbed on a receptor layer of a used surface stress sensor may remain, it is necessary to flow the fluid for cleaning as described above or a target fluid to be measured for co-washing for a long time, for example, causing a problem such as a decrease in measurement throughput.

In a thin film gas sensor that performs a gas measurement by heating a solid sensing membrane, although the thin film gas sensor is not a surface stress sensor, a substance having harmful effects on the measurement and adhering to a surface of the sensor is removed by heating the sensor immediately before the measurement, which is described in Patent Literature 2. Specifically, according to paragraph [0006] of Patent Literature 2, the temperature of the sensor (material: $SiO_2$) is heated to about 450° C. (time: 100 ms) immediately before the measurement and then the measurement is performed in order to stabilize a sensor operation by a cleaning step that desorbs moisture and other adsorbents adhering to the surface of the sensor. In Example of Patent Literature 2, it is disclosed that, as a heating element, a thin film heater 6 is disposed as one layer in a sensor formed of a laminated structure on a silicon substrate. However, since a surface stress sensor does not originally require such a heating mechanism of the above-described thin film gas sensor, it is necessary to add a new step to a manufacturing process thereof in order to add an element corresponding to the thin film heater 6. This is not desirable because this results in an increase in the price of a surface stress sensor. Furthermore, it is also disadvantageous to increase the heat capacity of a surface stress sensor due to an increase in the thickness of the surface stress sensor by adding a heating element such as a thin film heater. As a matter of course, the operation of a surface stress sensor is strongly affected by the elastic properties of a sensor body and a receptor layer, and these elastic properties change largely depending on the temperature. Therefore, when heating is performed after the heat capacity is increased as described above, it is difficult for the temperature of the surface stress sensor to return to the original temperature at the time of the measurement after heat cleaning, which is not preferable for the sensor operation.

SUMMARY OF INVENTION

Technical Problem

An object of the present invention is to easily and efficiently clean a receptor layer disposed on a surface of a thin film in a surface stress sensor that detects a change in surface stress of the thin film, the change being caused by the receptor layer, while minimizing a change in the structure of the surface stress sensor.

Solution to Problem

One aspect of the present invention provides a method for cleaning a receptor layer of a surface stress sensor, wherein the surface stress sensor detects a change in surface stress of a thin film, the change being caused by the receptor layer disposed on a surface of the thin film, and wherein the method including causing at least a part of a surface region of the thin film to generate heat or supplying heat to the receptor layer from an outside of the surface stress sensor.

Here, the thin film may be a silicon thin membrane, the surface stress sensor may detect the change in the surface stress by means of a piezoresistive portion disposed in a part of the silicon thin membrane, and the silicon thin membrane may be caused to generate heat by flowing a current through at least a part of the silicon thin membrane.

The surface stress sensor may further comprise a frame-shaped support member. The silicon thin membrane may be connected to the inside of the frame shape of the support member via a plurality of narrowed portions disposed on a periphery of the silicon thin membrane. The piezoresistive portion may be disposed in each of the narrowed portions.

The support member may be integrated with the silicon thin membrane.

The current may be caused to flow through the piezoresistive portion.

The current may be caused to flow through a region doped more heavily than the surroundings thereof, the region being disposed on the surface of the silicon thin membrane.

Heat may be supplied to the receptor layer by supplying radiant heat from a radiant heat source to at least one surface of the thin film.

The thin film may be a silicon thin membrane, and the radiant heat may be supplied from at least a side of the silicon thin membrane not having the receptor layer.

A heating gas flow may be supplied to at least one surface of the thin film.

Advantageous Effects of Invention

According to the present invention, efficient cleaning of a surface stress sensor such as a sensor that performs detection using a piezoresistor can be easily performed while structural complications are avoided as much as possible.

BRIEF DESCRIPTION OF DRAWINGS

FIGS. 2($a$) and 2($b$) are diagrams conceptually illustrating the structure of a piezoresistive portion of the MSS illustrated in FIG. 1.

DESCRIPTION OF EMBODIMENTS

Hereinafter, an embodiment of the present invention will be specifically described by exemplifying a surface stress sensor that detects a change in surface stress of a silicon thin membrane, the change being caused by a receptor layer disposed on a surface of the silicon thin membrane, by a piezoresistive portion disposed in a part of the silicon thin membrane. As a matter of course, the configuration of the surface stress sensor to which the cleaning method of the present invention can be applied is not limited to this configuration, and to a surface stress sensor that detects a change in surface stress of a predetermined thin film, the change being caused by a receptor layer disposed on a surface of the thin film, the cleaning method of the present invention can be applied.

According to one aspect of the present invention, in a surface stress sensor that detects a change in surface stress of a silicon thin membrane, the change being caused by a receptor layer disposed on a surface of the silicon thin membrane, by a piezoresistive portion disposed in a part of the silicon thin membrane, Joule heat is generated by causing a current to flow through at least a part of the silicon thin membrane, and desorption of a substance adsorbed on the receptor layer is promoted by utilizing rise in the temperature of the receptor layer due to the generation of Joule heat. As a result, desorption from the receptor layer can be performed rapidly, and therefore cleaning can be performed rapidly. According to this configuration, at least a part of the silicon thin membrane originally possessed by the above type of surface stress sensor is caused to generate heat. Therefore, the receptor layer can be rapidly cleaned without adding any further component to the surface stress sensor. In addition, this type of surface stress sensor uses a piezoresistive element, and therefore has a structure such as a conductive path for supplying a current to the piezoresistive portion in its original configuration. Therefore, a structure for supplying a current for heating can be achieved with almost no structural change to the surface stress sensor.

Figure 3:
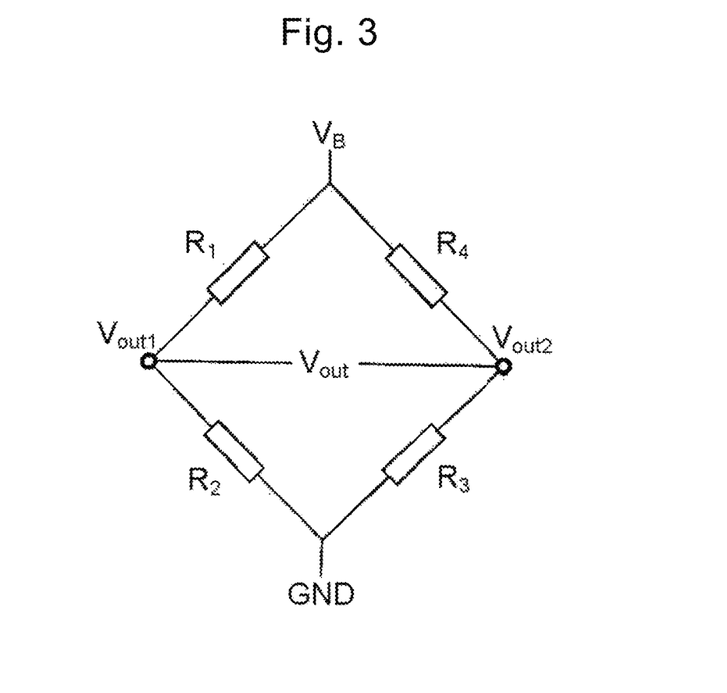
FIG. 3 is a conceptual diagram of a Wheatstone bridge formed of a piezoresistive portion of the MSS illustrated in FIG. 1.
Figure 4:
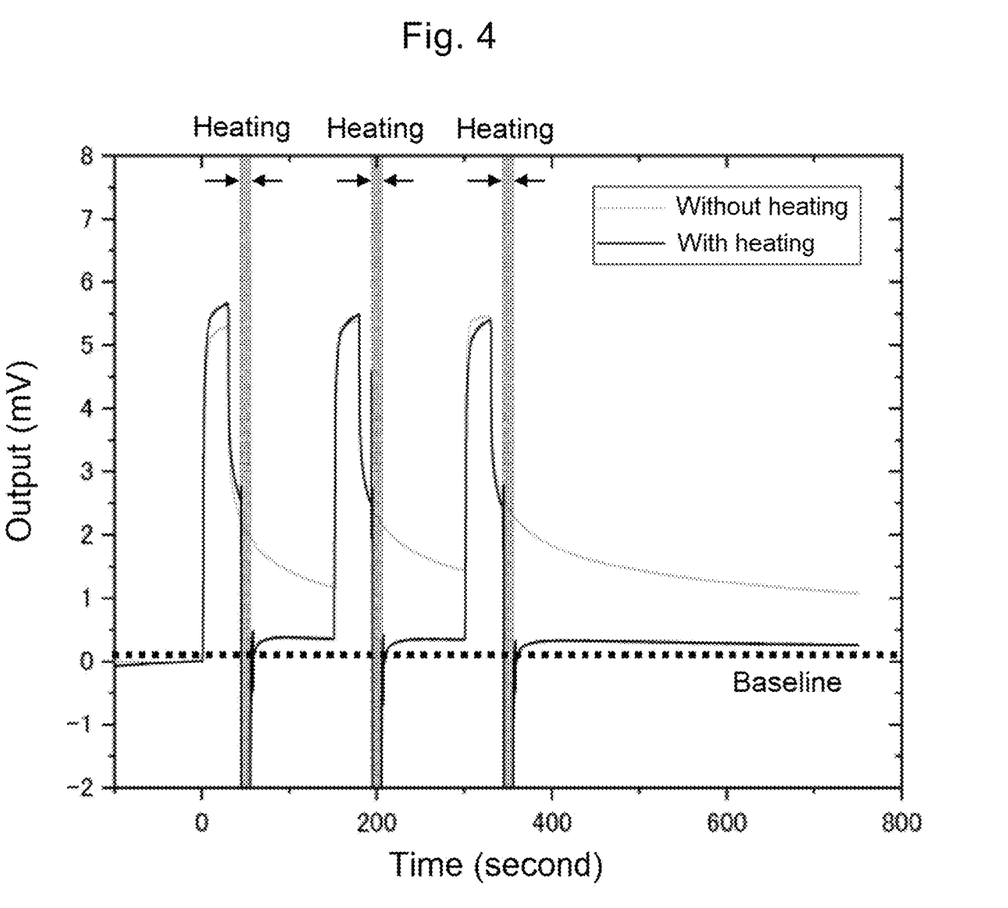
FIG. 4 illustrates graphs of output signals of MSS when measurements with and without heating are performed using a receptor layer obtained by depositing nanoparticles having amino groups on a surface of a silicon thin membrane of the MSS by spray coating, and using acetic acid vapor which is a headspace gas of acetic acid in a vial as a sample gas.

In particular, if heating for cleaning is performed by causing a current to flow through the piezoresistive portion itself, cleaning of the present invention can be implemented without making any change to a conventional surface stress sensor. Here, in MSS, piezoresistive portions $R_1$ to $R_4$ are connected to each other to form a Wheatstone bridge as illustrated in FIG. 3, and four terminals $V_B$, GND, $V_{out1}$, and $V_{out2}$ of this bridge can be accessed from the outside. Therefore, heating can be performed by applying a voltage between arbitrary terminals via the piezoresistive portion without modifying the structure of the existing MSS. For example, the terminals $V_{out1}$ and $V_{out2}$ may be short-circuited to have the same potential, and a voltage may be applied between the terminals and the terminal GND. Note that the piezoresistive portion is usually prepared by ion implantation or the like so as to have a different carrier from a surrounding bulk silicon portion. For example, a piezoresistive portion of MSS used in Example described below is p-type by doping an n-type bulk silicon portion with boron. Therefore, by applying a voltage so as to apply a reverse bias to the pn junction to suppress generation of a leakage current, the piezoresistive portion can be heated more efficiently.

Alternatively, a current may be caused to flow through a portion other than the piezoresistive portion. Note that, for example, when a silicon substrate that has not been doped is used as a material of the silicon thin membrane, by doping a part or the whole of the silicon thin membrane to some extent, a current for heating can flow through the part.

It should be noted here that a path for a current for heating formed in a portion other than the piezoresistor and the above-described piezoresistive portion is formed, strictly speaking, in a region expanding slightly inward of the silicon thin membrane rather than a geometric surface. However, the region at such a very shallow position formed by doping is substantially equivalent to the surface of the silicon thin membrane as long as heat conduction on which the present application has focused is concerned. Therefore, in the present application, it is expressed that the conductive region formed by doping on the silicon substrate exists on the surface of the silicon substrate.

In this case, it is necessary to prevent an operation of the piezoresistive portion from being adversely affected by doping. For example, in MSS, a Wheatstone bridge is constituted by disposing four piezoresistive portions on a periphery of a silicon thin membrane, and connecting these piezoresistive portions to each other as illustrated in FIG. 3. The path of a current (current for heating) flowing through a portion other than the piezoresistive portion on the silicon thin membrane as described above can be a path of a leakage current for the Wheatstone bridge. When the leakage current is larger than a certain level, the leakage current adversely affects an operation of the Wheatstone bridge. Therefore, it is necessary to adjust a heating current path and a resistance value thereof such that the leakage current in a measurement time section can be ignored. Since the MSS includes four piezoresistive portions on a periphery of the silicon thin membrane, power supply terminals of the piezoresistive portions can also be used as power supply terminals of the current path for heating. Specifically, when a region having relatively low resistance is formed on the silicon thin membrane between the adjacent or opposing piezoresistive portions, by applying a voltage between these piezoresistive portion pairs, a current for heating can be caused to flow therethrough. Of course, when such a region having relatively low resistance completely connects two piezoresistive portions to each other, the region becomes a leakage current path of the Wheatstone bridge as described above. Therefore, the region may be substantially electrically separated from at least one of the piezoresistive portions, and a conductive path or a terminal dedicated to the current for heating may be added, for example, in the vicinity of the piezoresistive portion separated from the region in addition to the piezoresistive portion concerned.

Figure 1:
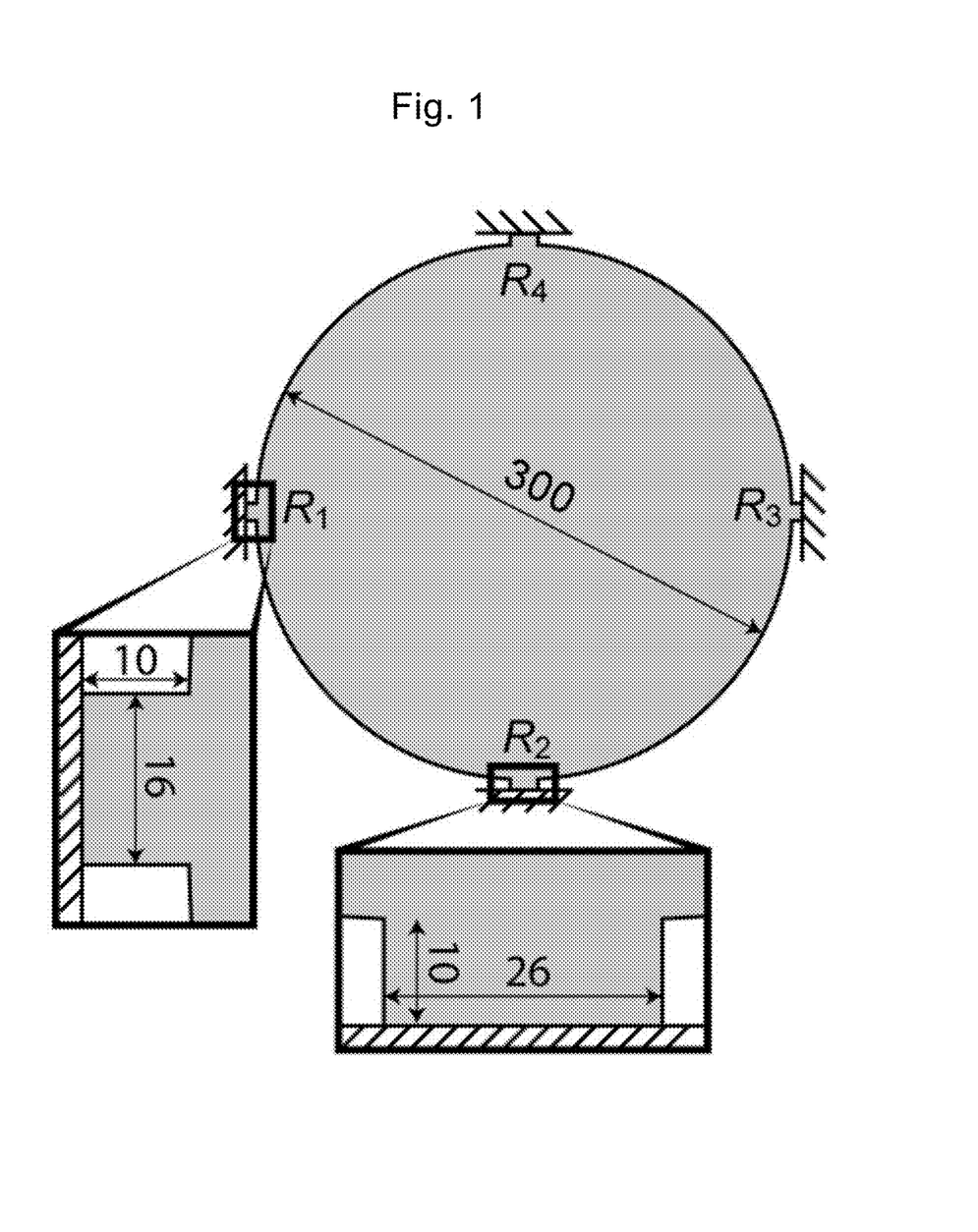
FIG. 1 is a diagram conceptually illustrating the structure of MSS used in Example. The unit of length indicated in the drawing is micrometer (μm).
Figure 1A:
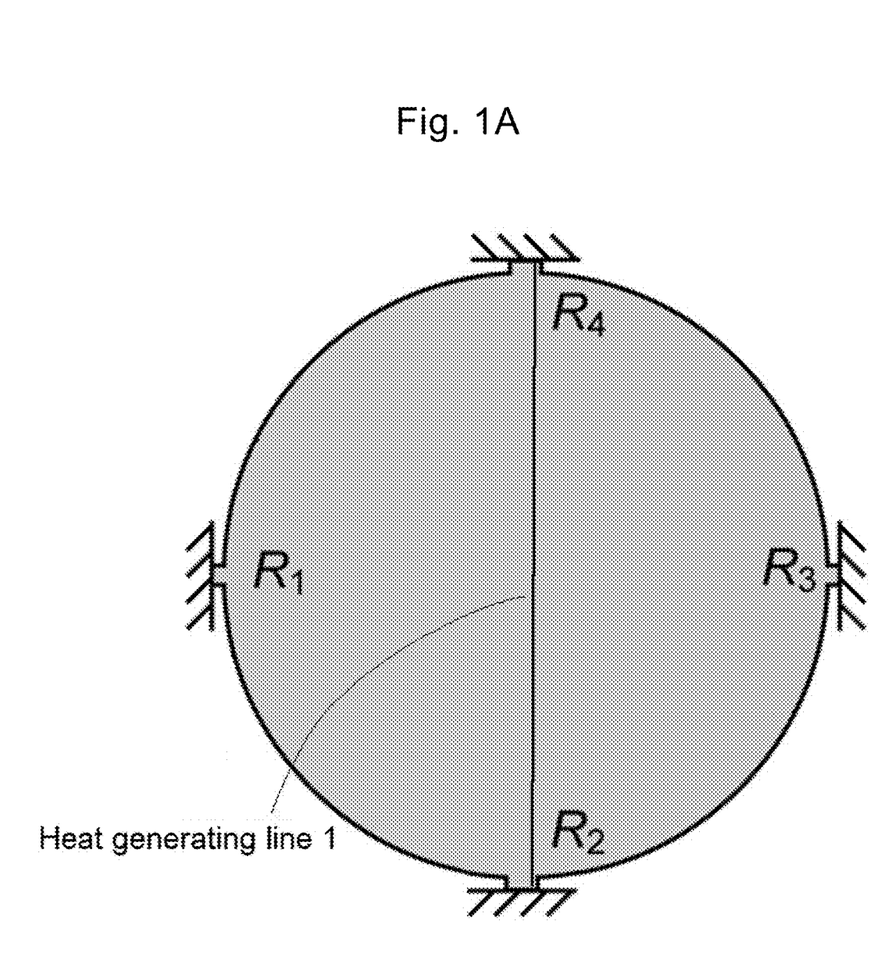
FIG. 1A is a conceptual diagram for describing an example of another mode of a method for cleaning a receptor layer of a surface stress sensor, the method including flowing current through a heat generating line disposed on a silicon thin membrane of the surface stress sensor.

More specifically, for example, in the aspect illustrated in FIG. 1A, the piezoresistive portions $R_1$ to $R_4$ are disposed in four regions on a periphery of the silicon thin membrane, and MSS is mechanically supported with respect to a member disposed around the MSS in the four regions, and is electrically connected to piezoresistors. For example, one line is formed on a surface of the silicon thin membrane between these opposing regions. This line can be achieved by doping the surface of the silicon thin membrane more heavily than that of the surroundings to make a resistance value lower than that of the surrounding silicon thin membrane. Both ends of this line can be electrically connected to a member (support member) disposed in the surroundings by bypassing the piezoresistive portions in the piezoresistive portion region and a conductive path for the piezoresistive portions (details of the detour will be described later). Therefore, by applying a voltage to both ends of the line via a conductive wire, a terminal, or the like appropriately disposed on this member, a desired current can be caused to flow through the line to generate heat in a controllable manner. Note that when the heavy doping is performed so as to have the same doping concentration as a piezoresistive element formed in the piezoresistive portion, it is not necessary to increase the number of process steps for manufacturing such a surface stress sensor or the number of masks used therefor. Therefore, it is possible to achieve a surface stress sensor capable of performing the cleaning method of the present invention without a large increase in cost. This line of the silicon thin membrane is illustrated as heat generating line 1 in FIG. 1A. In FIG. 1A, one heat generating line is linearly disposed in the central part of the MSS, but the number and shape of heat generating bodies such as the heat generating line are not limited thereto. For example, as illustrated in FIG. 1B, by curving two heat generating lines 1-1 and 1-2 in opposite directions to each other, the temperature of the surface of the silicon thin membrane can be relatively uniform as compared with the case of FIG. 1A.

Figure 1B:
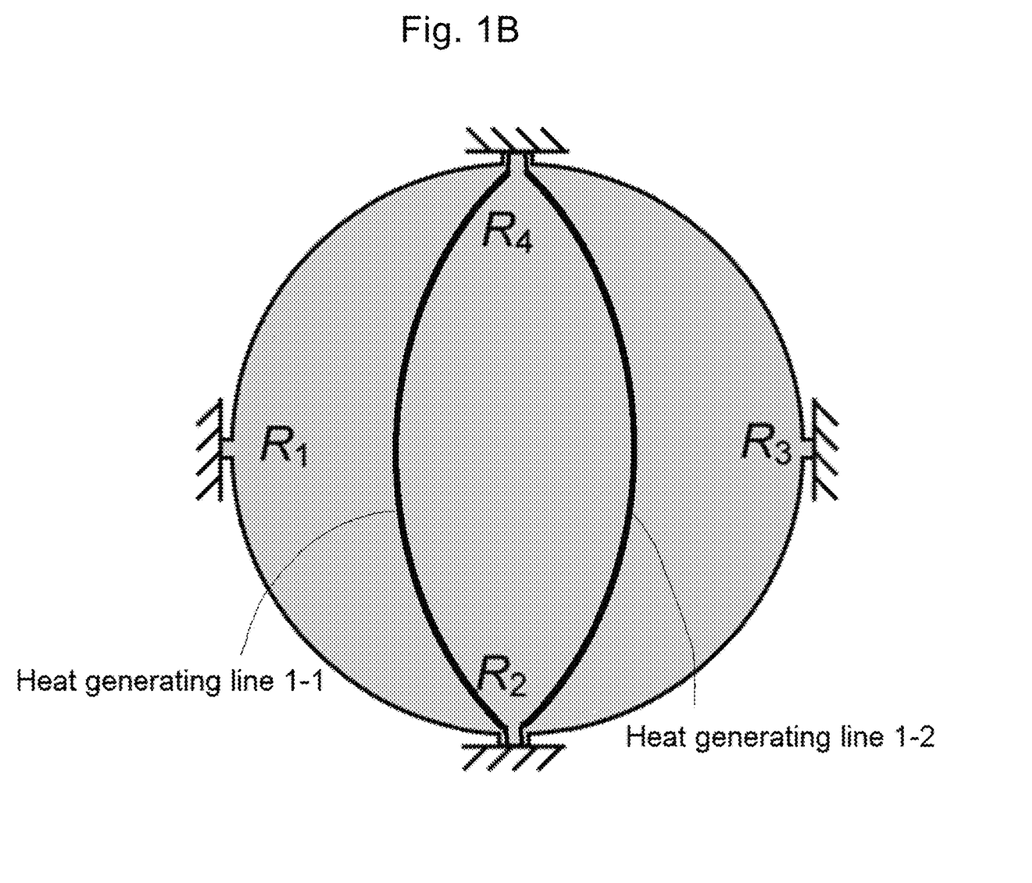
FIG. 1B is a conceptual diagram for describing an example of another mode of a method for cleaning a receptor layer of a surface stress sensor, the method including flowing current through a plurality of heat generating lines disposed on a silicon thin membrane of the surface stress sensor.
Figure 1C:
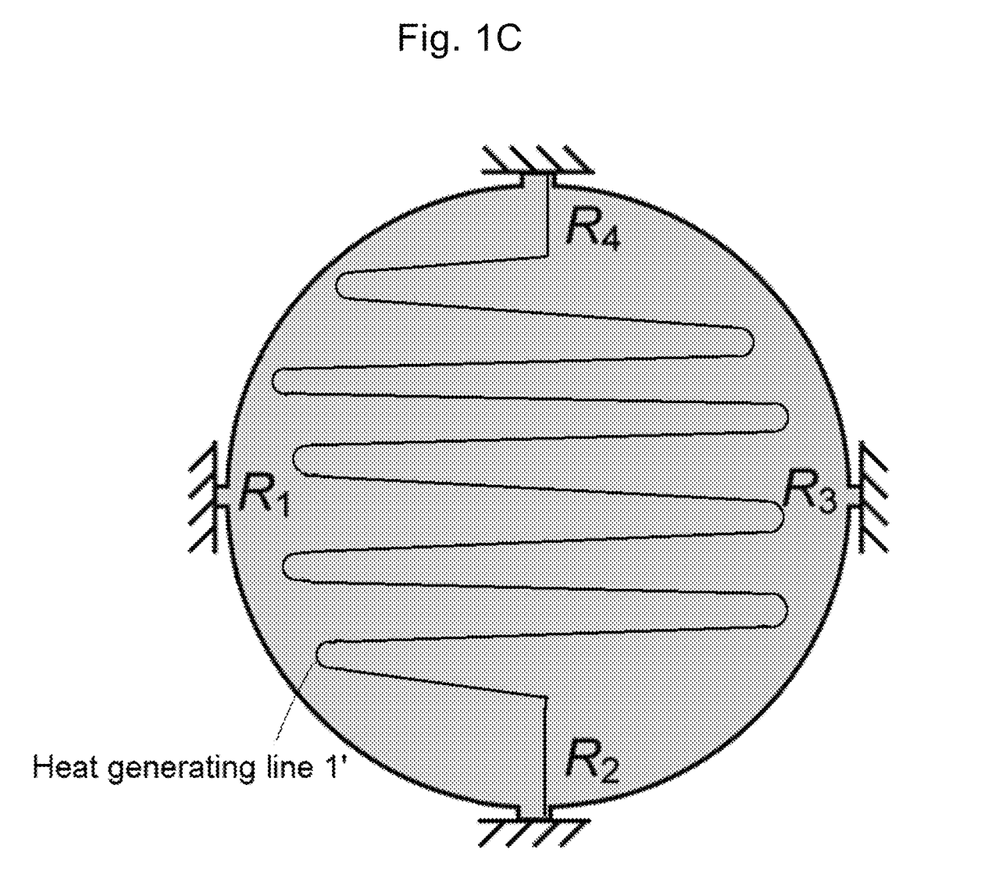
FIG. 1C is a conceptual diagram for describing an example of still another mode of a method for cleaning a receptor layer of a surface stress sensor, the method including flowing current through a heat generating line meanderingly disposed on a silicon thin membrane of the surface stress sensor.

By making the heat generating line on the silicon thin membrane not linear or curved with a large radius of curvature as illustrated in FIG. 1A or 1B but meandered or zigzag as illustrated as a heat generating line 1' in FIG. 1C, for example, such that all the points of the receptor layer applied onto the silicon thin membrane are within a relatively short distance from the heat generating line, the uniformity of the temperature can be further improved. Alternatively, although not illustrated, a heat generating line may be disposed between adjacent piezoresistive portions, that is, between $R_1$ and $R_2$ and/or between $R_3$ and $R_4$, instead of between opposing piezoresistive portions. The heat generating line can be achieved as a wider heating surface instead of the thin linear heat generating line.

Figure 2:
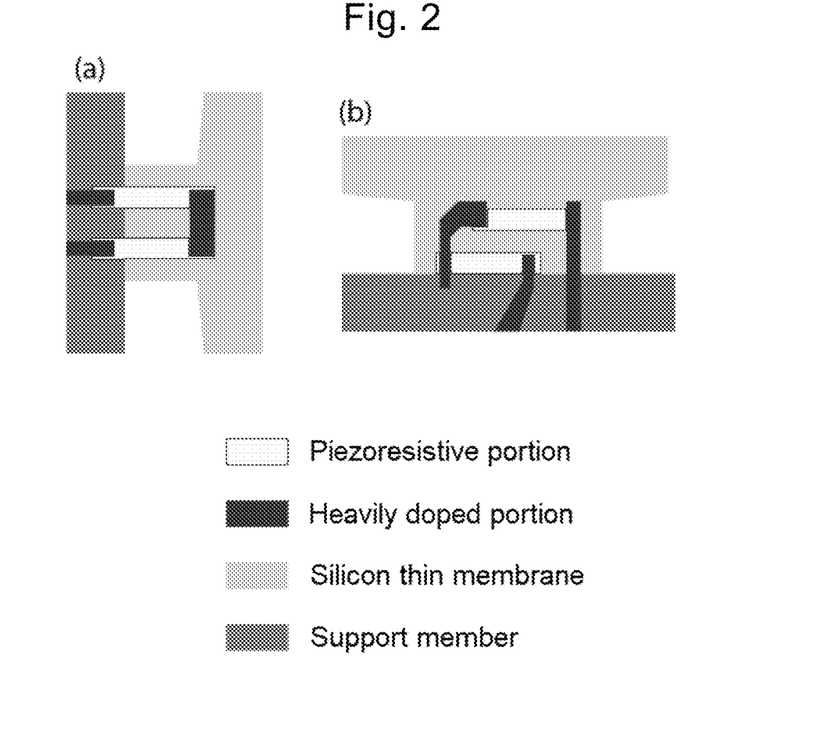

Here, a relationship between the above-described heat generating line and the piezoresistive portion will be described. In MSS, a piezoresistive portion is disposed in or near a narrowed portion that mechanically and electrically connects the silicon thin membrane to a support member disposed around the silicon thin membrane, and a conductive path that electrically connects the piezoresistive portion to the outside of the MSS is disposed. A region where a piezoresistive portion and a conductive path for the piezoresistive portion are disposed is referred to as a piezoresistive portion region above. A configuration example of this region is illustrated in FIGS. 2(a) and 2(b). In FIGS. 2(a) and 2(b), a black portion illustrated as "heavily doped portion" is the conductive path. As described above, in MSS, a piezoresistive portion is usually connected as a Wheatstone bridge as illustrated in an equivalent circuit of FIG. 3, and an output voltage $V_{out}$ thereof is taken out as an output signal of the MSS. Therefore, it is inconvenient that the presence of the heat generating line affects an operation of the Wheatstone bridge illustrated in FIG. 3. The simplest way to avoid this problem is that the heat generating line is electrically sufficiently separated from the piezoresistive portion and the conductive path for the piezoresistive portion (heavily doped portion in FIGS. 2(a) and 2(b)) at a point where the heat generating line passes through the piezoresistive portion region. More specifically, for example, in FIG. 2(b), the heat generating line only needs to pass through a position sufficiently separated from a conductive path (heavily doped portion) illustrated in black and running in the vertical direction near the right end of a narrowed portion. That is, the heat generating line only needs to bypass the piezoresistive portion and a conductive path thereof. FIGS. 1A to 1C illustrate that the heat generating lines 1, 1-1, 1-2, and 1' pass through a position deviated from the center of the narrowed portion when passing through the narrowed portion around the silicon thin membrane, that is, the heat generating lines 1, 1-1, 1-2, and 1' pass near an edge of the narrowed portion. This indicates the above configuration in which the heat generating line bypasses the narrowed portion or the piezoresistive portion located near the narrowed portion and a conductive path therefor with sufficient clearance. By adopting such a configuration and suppressing a leakage current between the heat generating line and the Wheatstone bridge to a low value that does not substantially affect an operation of the Wheatstone bridge, the above-described electrical separation can be achieved. More generally, the above-described electrical separation is to prevent formation of an extra current path in the equivalent circuit illustrated in FIG. 3. Therefore, it is not necessarily required to physically completely separate the heat generating line from the Wheatstone bridge. For example, even if one heat generating line is connected to the Wheatstone bridge at only one point, no other current path is added to the Wheatstone bridge, and therefore the above adverse influence does not appear. Alternatively, by adding a circuit modification, a measurement operation modification, or another modification, it is possible to avoid the above-described adverse influence on the output voltage $V_{out}$ during measurement.

Note that when an excessive voltage is applied to the surface stress sensor in order to cause a large cleaning current to flow to raise the temperature during cleaning in the present invention, the surface stress sensor may be destroyed. For example, in a specific sensor (MSS in this case) described in the following Example, when a voltage of thirty and several V was applied between terminals $V_{out1}$ and $V_{out2}$ in FIG. 3 in order to cause a large current to flow through a piezoresistive portion, this destruction occurred. As one of solutions to this problem, it is only required to reduce the ratio of Joule heat generated by a heating current leaking from a heat generating portion to a portion other than the silicon thin membrane. In particular, in MSS, a frame-shaped support member made of silicon and integrated with a silicon thin membrane is disposed around the silicon thin membrane, and the silicon thin membrane and the support member are connected to each other by four narrowed portions disposed on a periphery of the silicon thin membrane. As a result, the silicon thin membrane usually having a circular or square shape is accommodated inside the frame shape of the support member. This support member has higher rigidity than the silicon thin membrane, and therefore substantially functions as a rigid body with respect to the silicon thin membrane. As a result, a stress of the silicon thin membrane is concentrated on the narrowed portions, and an output of the piezoresistive portion disposed here is maximized. In this configuration, the piezoresistive portion is disposed adjacent to the support member which is a portion other than the silicon thin membrane. At this time, the support member functions as a heat sink, and when a heating current flows through the piezoresistive portion, a considerable part of heat generated in the piezoresistive portion leaks directly to the adjacent support member, that is, the heat sink.

In order to suppress heat leakage to the heat sink and improve heat utilization efficiency, it is necessary to increase thermal resistance between the heat sink (support member) and a heat generating portion and/or reduce thermal resistance between the heat generating portion and a central region of the silicon thin membrane. In order to increase the thermal resistance between the heat sink and the heat generating portion, the cross-sectional area of a portion of the support member connected to the narrowed portion of the silicon thin membrane is made as small as possible (specifically, the thickness of a substrate at this location is made as small as possible, for example). However, if this portion is made too thin, it cannot be said that the support member substantially functions as a rigid body when viewed from the silicon thin membrane. Therefore, stress concentration on the piezoresistive portion is small, and the sensitivity of the MSS decreases as a result. On the contrary, in order to reduce the thermal resistance between the heat generating portion and the central region of the silicon thin membrane, it is only required to separate the heat generating portion from the support member as much as possible and bring the heat generating portion close to the central region of the silicon thin membrane. Examples of a technique for this include use of a region closer to the center of the silicon thin membrane as a heating body instead of the piezoresistive portion (or in addition to the piezoresistive portion) as described above.

However, as can be seen from the following Example, even if the piezoresistive portion of the existing MSS in which such measures against heat leakage are not taken is used as it is as a heating body, it has been confirmed that by raising the temperature of the receptor layer to about 80° C., acetic acid and heptane can be almost eliminated from the receptor layer. Therefore, according to the present invention, it is possible to clean a receptor layer to a substantially considerable extent in many applications even when MSS in which no special measures against heat leakage are taken is used.

The receptor layer can be cleaned not only by flowing a current through a surface portion of the silicon thin membrane and performing heating with Joule heat thereof but also by heating the surface stress sensor from the outside thereof. Also, in this case, the structure of the surface stress sensor is not particularly complicated, and the weight and size of the surface stress sensor are unchanged. Therefore, heat capacity does not increase. Therefore, the surface stress sensor can be heated in a short time. After cleaning is completed, the temperature of the surface stress sensor can be returned to a temperature at which heating was not performed in a short time.

Figure 1D:
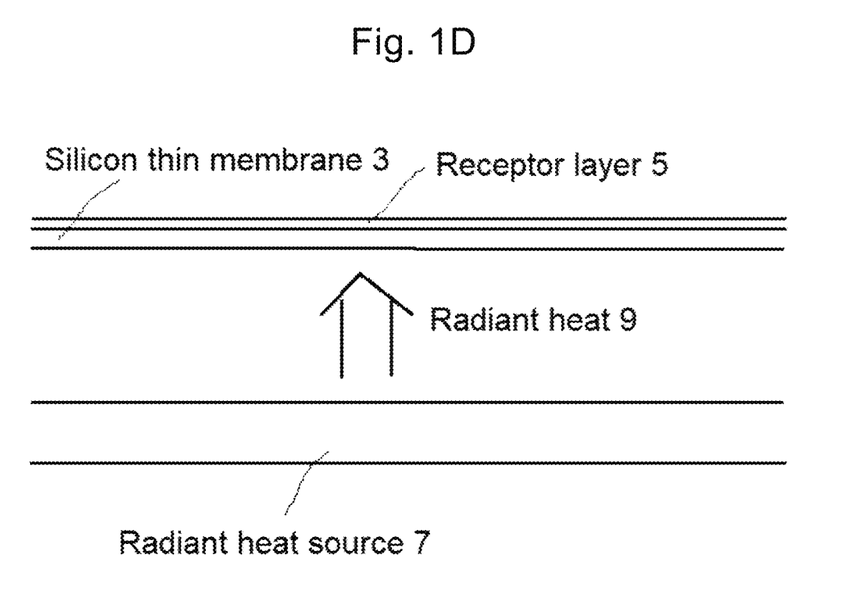
FIG. 1D is a conceptual diagram for describing another method for cleaning a receptor layer of a surface stress sensor, the method including supplying radiant heat from the outside of the surface stress sensor.

For example, a radiant heat source adjacent to but not in contact with (that is, separated from) the surface stress sensor is disposed, and the receptor layer can be heated by radiant heat from this heat source. As the radiant heat source, any number of radiant heat sources of any type and shape, such as a heater that generates heat by a current, may be used. FIG. 1D illustrates a conceptual cross-sectional view of a configuration in which a radiant heat source 7 is disposed on a surface (back surface) of the surface stress sensor that does not have the receptor layer 5 to supply radiant heat 9 to the receptor layer 5 via a silicon thin membrane 3. Note that this cross-sectional configuration diagram does not illustrate a container or the like that accommodates the surface stress sensor but illustrates a cross-section of only the central portion of the silicon thin membrane 3 to which the receptor layer 5 has been applied. When the surface stress sensor is formed of the silicon thin membrane 3, since silicon has a property of transmitting infrared rays in a wide wavelength range, by performing heat radiation in a form of an infrared ray having a wavelength that is easily absorbed by the receptor layer 5, heating can be performed efficiently. In particular, if an infrared light source having a strong peak in a specific wavelength region is used, heating can be performed more efficiently. By increasing the smoothness of the back surface of the silicon thin membrane 3, it is possible to suppress a decrease in transmittance of an infrared ray. A structure for supplying gas to the receptor layer is often disposed inside a container of the surface stress sensor near a side where the receptor layer of the surface stress sensor is disposed. Therefore, the back surface more easily secures a place where a radiant heat source is disposed in many cases. Of course, the radiant heat source may be disposed on the receptor layer side instead of the back surface.

Figure 1E:
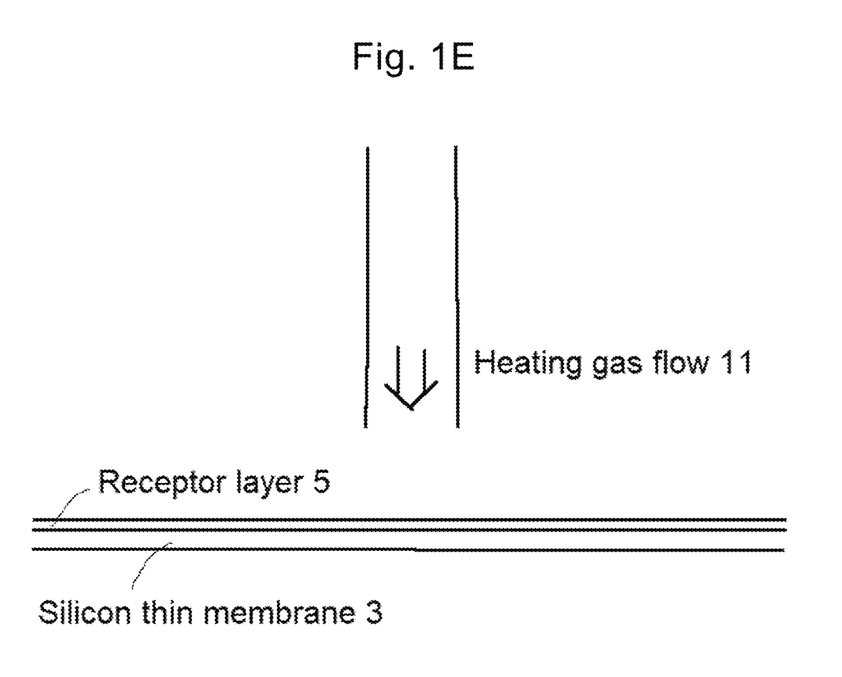
FIG. 1E is a conceptual diagram for describing another method for cleaning a receptor layer of a surface stress sensor, the method including supplying a heating gas flow from the outside of the surface stress sensor.

In order to supply heat from the outside of the surface stress sensor, a heating gas flow 11 may be blown to the surface stress sensor as illustrated in a cross-sectional view of FIG. 1E having the same form as FIG. 1D. The temperature of the heating gas flow 11 is set to a desired temperature of the receptor layer 5 or a temperature higher than the desired temperature by an appropriate temperature. A component of the heating gas flow 11 may be any gas as long as not being harmful to the measurement, but may be the same gas as a purge gas, for example. The heating gas flow 11 may be supplied via the same flow path as a gas (sample gas or purge gas) supplied to the surface stress sensor during the measurement, or a flow path dedicated to the heating gas may be disposed separately. Even when this cleaning method is adopted, the surface stress sensor itself can be the same as a normal one, and therefore the heat capacity thereof does not increase.

Example

MSS is used as a surface stress sensor below, but it should be noted that a receptor layer is cleaned by a similar action also in a cantilever-type surface stress sensor as another type of surface stress sensor unless otherwise specified.

In the present Example, FIG. 1 conceptually illustrates structures of a silicon thin membrane (having a thickness of about 2.5 µm) of MSS and a frame-shaped support member that accommodates the silicon thin membrane inside. Note that the silicon thin membrane has a disk shape in the drawing, but may have another shape such as a square (refer to Patent Literature 1). In FIG. 1, four narrowed portions are disposed along the periphery of the disk-shaped silicon thin membrane, and piezoresistive portions $R_1$ to $R_4$ are disposed in these narrowed portions, respectively. Enlarged views of these narrowed portions are also illustrated in FIG. 1. The support member supports the silicon thin membrane as a substantially rigid body along the periphery of the silicon thin membrane, and therefore hardly deforms even if stress applied to the support member via the narrowed portion changes by a change in surface stress applied to the silicon thin membrane due to expansion or contraction of a receptor layer (not illustrated) formed on the silicon thin membrane. As a result, stress concentration occurs in the narrowed portion, and a change in resistance of the piezoresistive portion disposed in the narrowed portion is maximized.

FIGS. 2(a) and 2(b) specifically illustrate the structure and dimensions of the surroundings of the piezoresistive portions $R_1$ and $R_2$ of MSS illustrated in FIG. 1. The surroundings of the piezoresistive portions $R_3$ and $R_4$ have the inverted shapes from the shapes of the surroundings of the piezoresistive portions $R_1$ and $R_2$, respectively, and therefore omitted in FIGS. 2(a) and 2(b). By connecting these piezoresistive portions $R_1$ to $R_4$ to each other using wiring formed on the support member, a Wheatstone bridge as illustrated in FIG. 3 is formed. In a measurement using an MSS, a predetermined voltage (−0.5 V in this case) was applied between terminals $V_B$ and GND of the Wheatstone bridge, and a voltage $V_{out}$ that appeared between terminals $V_{out1}$ and $V_{out2}$ at this time was taken out as an output voltage. When heating was performed, an appropriate voltage (−20 V in this case) was applied between the terminals $V_{out1}$ and $V_{out2}$.

In addition, a change in a piezoresistive value is detected by applying the above predetermined voltage −0.5 V to the piezoresistive portion even while measurement of a surface stress is performed instead of heating. Therefore, strictly speaking, even during this period, the piezoresistive portion generates heat. As described in the section of Background Art, raising the temperature during the measurement may introduce an error in a measurement result of a surface stress. However, as a result of examination by the inventors of the present application by performing a measurement, simulation, and the like, it was confirmed that even when a voltage (typically −0.5 V described above) necessary for detecting a change in resistance was applied to the piezoresistive portion, a rise in temperature due to the application of the voltage was so small and had no substantial influence on the measurement result. In particular, since an MSS has a large heat sink effect on the surrounding support member against heat generation of the piezoresistive portion due to the structure thereof, the temperature rise is even smaller than that of a cantilever-type surface stress sensor.

Note that the MSS used in the present Example is substantially the same as that described as 2G-MSS in Non Patent Literature 1 (provided that the diameter of the disk-shaped silicon thin membrane is 300 µm), and therefore refer to Non Patent Literature 1 for further details. In addition, please refer to Patent Literature 1 and Non Patent Literature 1 for the detailed operation of MSS, a peripheral circuit of MSS for a measurement with MSS, and the like.

In an experiment for confirming an effect of cleaning the receptor layer of MSS, MSS to which two types of receptor layers had been applied, respectively (MSS in which nanoparticles having amino groups had been applied to a surface of a silicon thin membrane of MSS by spray coating and MSS in which nanoparticles having phenyl groups had been applied to a surface of a silicon thin membrane of MSS with an inkjet spotter) were prepared, and four combinations obtained by combining these MSS with two types of sample gases (acetic acid vapor which is a headspace gas of acetic acid in a vial and heptane vapor which is a headspace gas of heptane in a vial) were used. A nitrogen gas was used for all the combinations as a carrier gas, and a flow rate was 100 sccm for both the sample gas and the carrier gas.

FIGS. 4 to 7 illustrate graphs of measurement results for the four combinations of two types of MSS with different receptor layers and two types of sample gases. As can be seen from these graphs, each measurement cycle consists of a sample supply phase (30 seconds) in which the carrier gas passes through a headspace of a vial containing a sample and then flows to MSS in the first half, and a purge phase (120 seconds) in which only the carrier gas flows to the MSS in the second half. Here, in the experiment, in addition to a measurement of Example in which cleaning by heating was performed for each measurement cycle, a measurement according to prior art in which cleaning by heating was not performed was also performed for comparison. On each graph, measurement results of Example were plotted with a dark solid line, and measurement results according to prior art were plotted with a light solid line. In the measurement of Example, by applying a heating voltage between terminals $V_{out1}$ and $V_{out2}$ of MSS for a short time (10 seconds from 15 seconds to 25 seconds after the start of purging) in the middle of the purge phase as described above, the receptor layer was heated and cleaned. Note that in the graphs, it seems that the purge phase is present even before the first cycle, but this indicates that the carrier gas continuously flows through MSS until the measurement start time (time=0 seconds).

When the measurement results of Example are compared with the measurement results according to prior art on each graph, in the measurement results according to prior art (light solid line), an output signal gradually approaches a baseline during the purge phase, but a subsequent sample supply phase starts long before reaching the baseline. Therefore, on one hand, this indicates that a sample absorbed in the receptor layer during the previous measurement may affect the subsequent measurement. On the other hand, in the measurement result of Example (dark solid line), an output signal returns to the vicinity of the baseline when a subsequent sample supply phase starts after the heating period ends. Therefore, it is determined that a sample absorbed during the previous measurement has been almost completely removed from the receptor layer. Note that in some graphs, the plot of measurement results of Example has not completely returned from undershoot immediately after an end of the heating period even at the time of start of a subsequent sample supply phase. However, even in this case, the situation is fairly good as compared with the degree of discrepancy between the plot of measurement results according to prior art and the baseline at the time of start of the subsequent sample supply phase.

Figure 5:
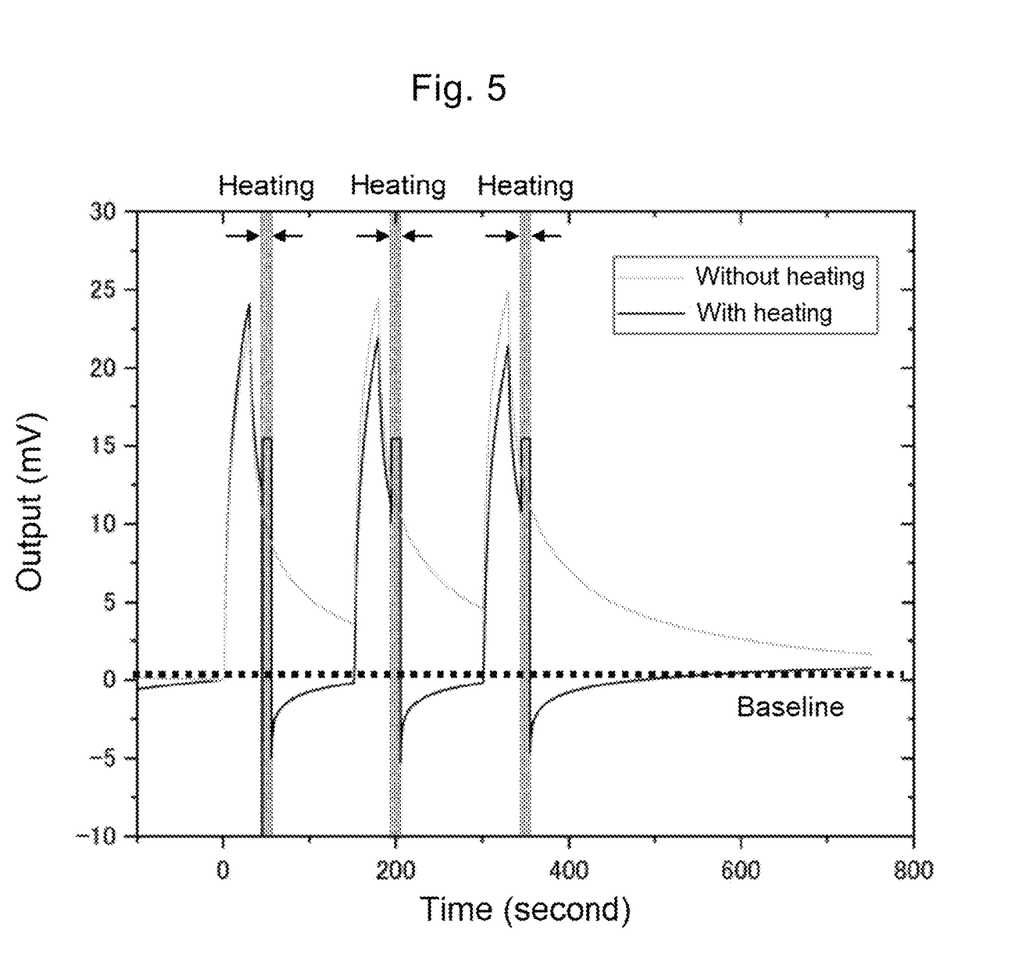
FIG. 5 illustrates graphs of output signals of MSS when measurements with and without heating are performed using a receptor layer obtained by depositing nanoparticles having phenyl groups on a surface of a silicon thin membrane of the MSS with an inkjet spotter, and using acetic acid vapor which is a headspace gas of acetic acid in a vial as a sample gas.
Figure 6:
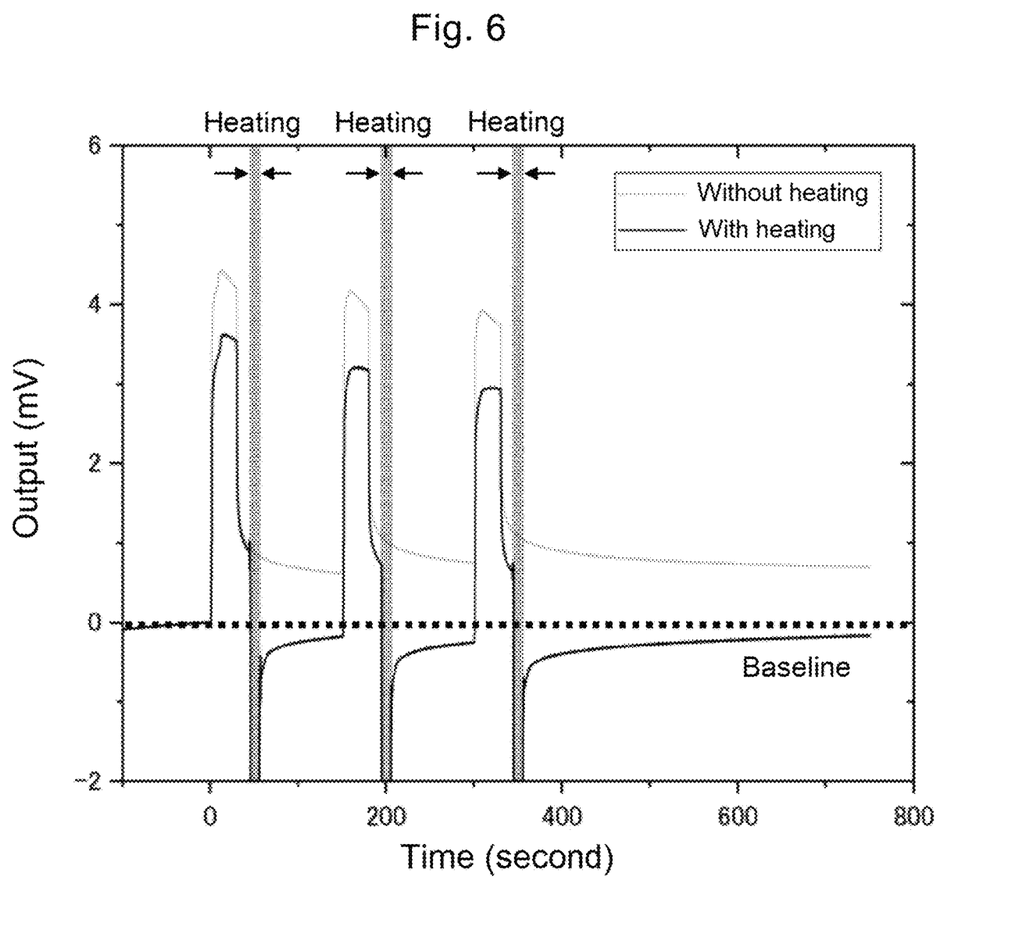
FIG. 6 illustrates graphs of output signals of MSS when measurements with and without heating are performed using a receptor layer obtained by depositing nanoparticles having amino groups on a surface of a silicon thin membrane of the MSS by spray coating, and using heptane vapor which is a headspace gas of heptane in a vial as a sample gas.
Figure 7:
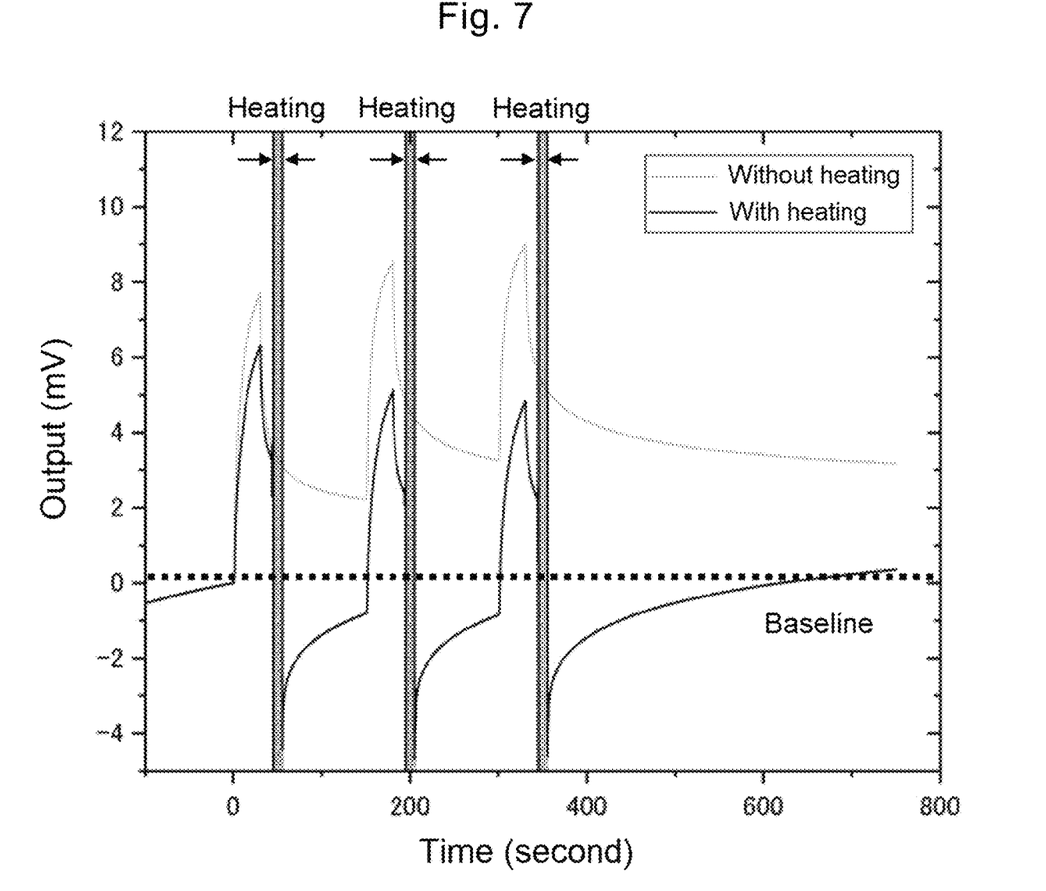
FIG. 7 illustrates graphs of output signals of MSS when measurements with and without heating are performed using a receptor layer obtained by depositing nanoparticles having phenyl groups to a surface of a silicon thin membrane of the MSS with an inkjet spotter, and using heptane vapor which is a headspace gas of heptane in a vial as a sample gas.

Here, description will be made for a phenomenon that a value of an output signal during the heating period jumps out of a voltage range on the vertical axis in the graphs of FIGS. 4 to 7 or indicates a constant value (15 mV) in FIG. 5. As described above, the output signal is the voltage $V_{out}$ between the terminals $V_{out1}$ and $V_{out2}$ of the Wheatstone bridge illustrated in FIG. 3. However, during the heating period, by applying −20 V between these terminals, a current flowed through the piezoresistive portions $R_1$ to $R_4$. Therefore, −20 V appears as $V_{out}$. In the actual measurement, the measurement system was constituted such that an overvoltage protection circuit was activated during this period to shut down a voltage measurement circuit and record that the output signal was 0 V. Meanwhile, the baseline of the output signal $V_{out}$ usually has a slight offset, and in the raw data of this experiment, that is, in the recorded measurement result itself, the baseline was not completely 0 V. When a human reads a graph, it is easier to understand the graph when the baseline is 0 V. Therefore, FIGS. 4 to 7 illustrate graphs in which the voltage values of the raw data are shifted such that the baseline is 0 V. For this reason, the value of the output signal during the heating period, which is 0 V on the raw data, is also shifted, and therefore jumping out of the range as described above appears on the graph.

Note that in the present Example, it was confirmed that the receptor layer temperature rose to about 80° C. during the heating period. This was verified by placing each of small pieces of three substances with different melting points (menthol (melting point 31° C.), vanillin (melting point 81 to 83° C.), and citric acid (melting point 153° C.)) on a silicon thin membrane, heating each of the small pieces under a microscope, and visually observing whether or not each of these small pieces had been melted. The small pieces were observed while a voltage applied between the terminals $V_{out1}$ and $V_{out2}$ was changed, and menthol melted when the applied voltage was about −20 V, and vanillin melted when the applied voltage was about −20 V. Meanwhile, citric acid did not melt even when a voltage of −30 V or more was applied. From these results, it was determined that the temperature of the receptor layer reached the above-described value of about 80° C. at the applied voltage of −20 V in the present Example. As described above, it is considered that the temperature of the receptor layer can be further raised by measures such as reducing dissipation of heat from the silicon thin membrane of MSS to the outside during heating. However, the results of the present Example indicate that a considerable effect is exhibited only by raising the temperature of the receptor layer to about 80° C.

In the above-described Example, heating was performed by applying the required voltage between the terminals $V_{out1}$ and $V_{out2}$, but heating can also be performed by applying a voltage between other terminals. For example, terminals $V_{out1}$ and $V_{out2}$ may be short-circuited, and a voltage may be applied between the terminals $V_{out1}$ and $V_{out2}$ and the terminal GND. In the latter case, a reverse bias was applied to the two piezoresistive portions of $R_2$ and $R_3$, and therefore vanillin melted at a lower applied voltage (about −14 V) as compared with the former case where a voltage was applied between the terminals $V_{out1}$ and $V_{out2}$ and a forward bias was partially applied. Therefore, heating could be performed more efficiently with this connection form.

INDUSTRIAL APPLICABILITY

As described above, the present invention makes it possible to implement good cleaning of a receptor layer of a surface stress sensor by a simple method, and therefore it is expected that an application of the surface stress sensor will be further promoted.

CITATION LIST

Patent Literature

Patent Literature 1: WO 2011/148774 A
Patent Literature 2: JP 2011-169634 A

Non Patent Literature

Non Patent Literature 1: G. Yoshikawa, T. Akiyama, F. Loizeau, K. Shiba, S. Gautsch, T. Nakayama, P. Vettiger, N. Rooij and M. Aono. Sensors, 2012, 12, 15873-15887.

The invention claimed is:

1. A method for cleaning a receptor layer of a surface stress sensor,
wherein the surface stress sensor detects a change in surface stress of a silicon thin membrane, the change being caused by the receptor layer disposed on a surface of the silicon thin membrane, and
wherein the method comprises causing at least a part of a surface region of the silicon thin membrane to generate heat by causing a current to flow through at least a part of the silicon thin membrane.

2. The cleaning method according to claim 1, wherein the surface stress sensor detects the change in the surface stress by means of a piezoresistive portion disposed in a part of the silicon thin membrane.

3. The cleaning method according to claim 2, wherein the surface stress sensor further comprises a frame-shaped support member, and
the silicon thin membrane is connected to an inside of the frame shape of the support member via a plurality of narrowed portions provided along a periphery of the silicon thin membrane, and the piezoresistive portion is disposed in the narrowed portion.

4. The cleaning method according to claim 3, wherein the support member is integrated with the silicon thin membrane.

5. The cleaning method according to claim 2, wherein the current is flowed through the piezoresistive portion.

6. The cleaning method according to claim 2, wherein the current is flowed through a region doped more heavily than surroundings thereof, the region being provided on a surface of the silicon thin membrane.

* * * * *